United States Patent [19]

Fukuzawa et al.

[11] Patent Number: 5,001,536
[45] Date of Patent: Mar. 19, 1991

[54] SEMICONDUCTOR DEVICE

[75] Inventors: Tadashi Fukuzawa, Setagaya; Michiharu Nakamura, Nishitama; Eizaburo Yamada, Tama, all of Japan

[73] Assignee: Hitachi, Ltd., Tokyo, Japan

[21] Appl. No.: 298,764

[22] Filed: Jan. 17, 1989

Related U.S. Application Data

[63] Continuation of Ser. No. 51,696, May 20, 1987, abandoned, which is a continuation of Ser. No. 806,337, Dec. 9, 1985, abandoned, which is a continuation of Ser. No. 388,612, Jun. 15, 1982, abandoned.

[30] Foreign Application Priority Data

Jun. 17, 1981 [JP] Japan .................................. 56-92304
Jan. 29, 1982 [JP] Japan .................................. 57-11663

[51] Int. Cl.$^5$ .................. H01L 29/80; H01L 29/161; H01L 27/02; H01L 27/12
[52] U.S. Cl. ......................................... 357/22; 357/16; 357/42; 357/4; 357/23.2
[58] Field of Search ..................... 357/22, 16, 42, 4, 15, 357/23.2, 23.15

[56] References Cited

U.S. PATENT DOCUMENTS

| | | | |
|---|---|---|---|
| 3,273,030 | 9/1966 | Balk et al. ........................... | 357/22 A |
| 3,653,999 | 4/1972 | Fuller ..................................... | 357/67 |
| 4,157,556 | 6/1979 | Decker et al. ..................... | 357/22 A |
| 4,194,935 | 3/1980 | Dingle et al. ........................ | 357/22 |
| 4,262,340 | 4/1981 | Sasaki et al. ....................... | 357/42 |
| 4,291,327 | 9/1981 | Tsang ................................. | 357/23.2 |
| 4,424,525 | 1/1984 | Mimura et al. ..................... | 357/22 A |
| 4,471,366 | 9/1984 | Delagebeaudeuf et al. ...... | 357/22 A |
| 4,734,750 | 3/1988 | Okamura et al. .................. | 357/22 A |
| 4,755,857 | 7/1988 | Abstreiter et al. ................ | 357/22 A |

FOREIGN PATENT DOCUMENTS 2913068 10/1980 Fed. Rep. of Germany ........ 357/22

*Primary Examiner*—Mark Prenty
*Attorney, Agent, or Firm*—Antonelli, Terry, Stout & Kraus

[57] ABSTRACT

In a semiconductor device having, at least, a first semiconductor layer which contains substantially no impurity, a second semiconductor layer which has a band gap greater than that of the first semiconductor layer and which contains an impurity, an interface between the first and second semiconductor layers forming a heterojunction, at least one pair of electrodes which are electronically connected with the first semiconductor layer, and means to control carriers developing at the heterojunction interface; a semiconductor device characterized in that the first semiconductor layer is a Ge layer, while the second semiconductor layer is a group III-V compound semiconductor layer.

30 Claims, 5 Drawing Sheets

P-GaAs 14 | UNDOPE Ge 12 | UNDOPE GaAs 22

SEMICONDUCTOR DEVICE

This application is a continuation application of application Ser. No. 051,696, filed May 20, 1987 and now abandoned which is a continuation application of application Ser. No. 806,337, filed Dec. 9, 1985 and now abandoned, which is a continuation application of application Ser. No. 388,612, filed Jun. 15, 1982 and now abandoned.

BACKGROUND OF THE INVENTION

1. Field of the Invention

This invention relates to semiconductor devices with enhanced hole mobility.

2. Description of the Prior Art

A complementary field effect transistor which employs Si as a semiconductor material uses a p-type channel and an n-type channel, and utilizes the fact that the characteristics of switching currents by the gates thereof are reverse to each other. Accordingly, it has the advantage that a signal can be amplified without permitting any considerable current to flow through field effect transistors (hereinbelow, abbreviated to "FETs") and that a logic operation is possible with a very low power consumption. Most of present-day ICs (integrated circuits) in which logic circuits are built are semiconductor devices of this type. The operating speed of the element, however, is determined by the value of either lower one of hole and electron mobilities (respectively denoted by $\mu_h$ and $\mu_e$). In case of Si, $\mu_h = 480 \text{ cm}^2\text{V}^{-1}\text{sec}^{-1}$ determines the speed of the element. In addition, a semiconductor material GaAs is higher in $\mu_e$ than Si and is deemed a material for the ultrahigh speed devices of the coming generation. Since, however, the hole mobility ($\mu_h$) of this material is 300 cm$^2$V$^{-1}$sec$^{-1}$ and is lower than that of Si, the high electron mobility being an advantage is not exploited in a practicable semiconductor device even when the semiconductor device of the complementary type is fabricated. Accordingly, the material cannot be fully utilized for semiconductor devices which will form the mainstream of ICs and LSIs (large scale integrated circuits).

High speed switching elements utilizing larger electron mobility of GaAs have heretofore been proposed, as exemplified by T. Mimura et al. "Japanese Journal of Applied Physics" vol. 19, L 225, 1980.

SUMMARY OF THE INVENTION

The present invention provides a multilayered-structure semiconductor device which has a high hole mobility and which can generate a sufficient signal current.

According to the multilayered-structure semiconductor device of the present invention, a complementary type semiconductor device capable of fast operation and exhibitive of very low power consumption can be realized with a group III-V compound semiconductor material.

The fundamental technical idea of the present invention consists in intending to utilize as the carrier of a signal, a two-dimensional hole gas which develops at the hetero-structure interface between a group III-V semiconductor layer heavily doped into the p-type and a Ge layer of very low impurity concentration. Thus, the semiconductor device having the high hole mobility can be realized.

As typical semiconductor materials being binary, ternary or quaternary solid solutions among the group III-V compound semiconductors, the following materials can be mentioned:

GaAs, $Ga_{1-x}Al_xAs$, $Al_xIn_{1-x}P$, $Al_xIn_{1-x}As$, $GaAs_xSb_{1-x}$, $AlAs_xSb_{1-x}$, $Ga_xIn_{1-x}P$, $Ga_xIn_{1-x}As$, $Al_xGa_{1-x}As_ySb_{1-y}$, $Ga_xIn_{1-x}As_yP_{1-y}$, $Ga_xIn_{1-x}As_ySb_{1-y}$.

Above all, GaAs is a practically useful material. It is a compound semiconductor of the binary system, and is easy of manufacture.

DETAILED DESCRIPTION OF THE PREFERRED EMBODIMENTS

The group III-V semiconductor layer and the Ge layer are grown by, for example, the molecular beam epitaxial method (hereinbelow, abbreviated to the "MBE method"). They are lattice-matched to a practically sufficient extent. Typical examples of the materials of the former layer are as mentioned before. As these materials, there are selected semiconductor materials which belong to group III-V binary, ternary or quaternary solid solutions and which have lattice constants of 5.658±0.05 Å and energy band gaps of values greater than 0.66 eV.

In order to prevent the lattice mismatching of the compound semiconductors with Ge, the compositions are usually selected within the following ranges of mole fractions $Ga_{1-x}Al_xAs$ ($0 \leq X \leq 1$)
$Al_xIn_{1-x}P$ ($0.4 \leq X \leq 0.6$)
$Al_xIn_{1-x}As$ ($0.9 \leq X \leq 1$)
$GaAs_xSb_{1-x}$ ($0.9 \leq X \leq 1$)
$AlAs_xSb_{1-x}$ ($0.9 \leq X \leq 1$)
$Ga_xIn_{1-x}P$ ($0.4 \leq X \leq 0.6$)
$Ga_xIn_{1-x}As$ ($0.9 \leq X \leq 1$)

The layers of these semiconductor materials being group III-V ternary or quaternary solid solutions are doped into the p-type at impurity concentrations on the order of $5 \times 10^{16}/\text{cm}^3 - 2 \times 10^{18}/\text{cm}^3$. The thickness of each p-type semiconductor layer is set at approximately 300Å-3000Å. The density of holes is basically determined by the impurity concentration of the p-type semiconductor layer and the thickness thereof.

As dopants, there are used Be, Zn, Cd etc.

The Ge layer is usually left undoped or naturally doped. Be, Al, Ga, In etc. are considered as impurities in the Ge layer, and are usually at or below $1 \times 10^{15}/\text{cm}^3$. More preferably, the impurity concentration is made $1 \times 10^{14}/cm^3$ or less. The thickness of the Ge layer is made at least 500Å. It is set, in general, within a range of 500Å-3000Å, and more preferably 500Å-1000Å. Although the Ge layer may well be still thicker, it need not be thickened unnecessarily.

Hereunder, the present invention will be described by taking GaAs as the typical example of the group III-V compound semiconductor materials. Needless to say, similar operations can be effected with the other group III-V compound semiconductor materials.

The GaAs layer is doped into the p-type at an impurity concentration on the order of $5 \times 10^{16}/cm^3 - 2 \times 10^{18}/cm^3$. The thickness of the p-type GaAs layer is set at approximately 300Å-3000Å. The density of holes is basically determined by the impurity concentration of the GaAs layer and the thickness thereof.

Figure 1:
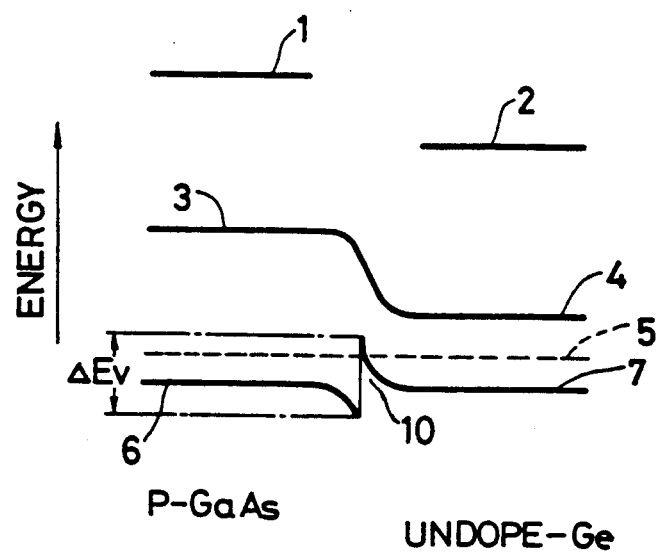
FIG. 1 is a schematic energy band diagram at the junction between a p-type GaAs layer and an undoped Ge layer.

FIG. 1 shows the energy band diagram of a multilayered p-type GaAs-undoped Ge structure. In addition, FIG. 2 shows the energy band diagram of multilayered n-type GaAs-undoped Ge structure.

Figure 2:
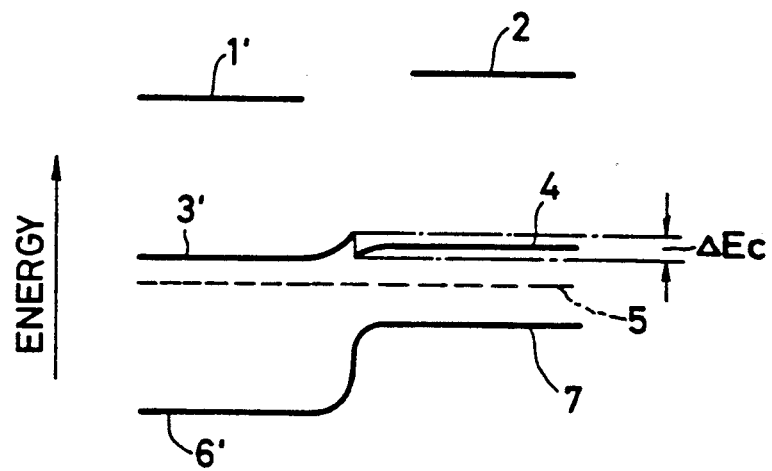
FIG. 2 is a schematic energy band diagram at the junction between an n-type GaAs layer and an undoped Ge layer.

In FIGS. 1 and 2, numerals 1 and 1' designate the vacuum levels of GaAs, numeral 2 the vacuum level of Ge, numerals 3 and 3' the bottom parts of the conduction bands of GaAs, numeral 4 the bottom part of the conduction band of Ge, numeral 5 the Fermi level, numerals 6 and 6' the top parts of the valence bands of GaAs, numeral 7 the top part of the valence band of Ge, and symbol $\Delta E_v$ the gap of the valence band, which is 0.69 eV in this example. $\Delta E_c$ indicates the gap of the conduction band, which is 0.06 eV in this example.

Among impurity atoms with which the p-GaAs layer has been doped, those neighboring the interface between the p-GaAs layer and the Ge layer transfer holes into the Ge layer of lower energy, so that the Ge layer can have a sufficient hole density ($N_h$) in spite of scarcely possessing ionized impurity atoms ($N_I$) in itself.

Therefore, the density of holes required for conduction can be attained without scattering by the ionized impurity. More preferably in practical use, an undoped GaAs layer which is about 20-70Å thick is disposed at the interface between the p-GaAs layer and the Ge layer in order to avoid the lowering of the mobility of holes attributed to the fact that the holes accumulated in the spike-like carrier profile of the valence band at the interface between the p-GaAs layer and the undoped Ge layer are subjected to the Coulomb scattering of ionized impurity atoms in the p-GaAs layer. This measure is also effective to prevent ions from mixing from the p-GaAs layer into the Ge layer.

In case of keeping the element of the above construction at a low temperature, holes having a high hole mobility exist in the spike-like carrier profile 10 of the valence band at a sufficient concentration without the freezing of carriers unlike the situation of a case of cooling p-type Ge alone.

The two-dimensional hole gas in such state is utilized as the carriers of a signal. By way of example, ohmic contacts with the two-dimensional hole gas existing in the portion 10 are provided in two places and are respectively used for a source and a drain, and a gate is disposed therebetween so as to control the flow of the holes, whereby a semiconductor device of very high carrier mobility can be realized. Such structure is applicable to the channel region of a field effect transistor.

Figure 3:
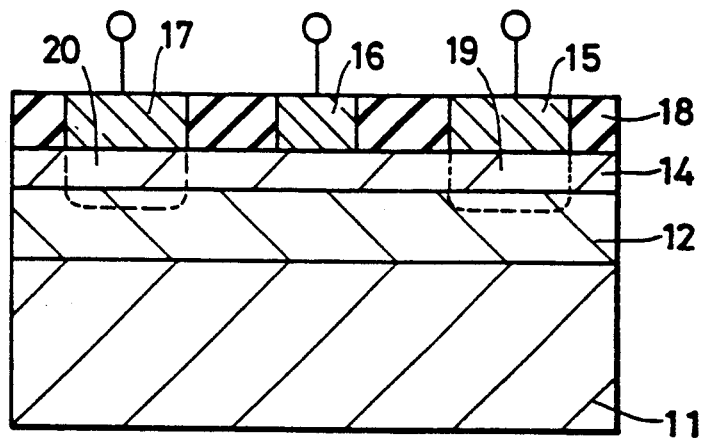
FIGS. 3, 4, 5, 6 and 8 are sectional views of devices each showing an embodiment of the present invention.

Embodiment 1:

FIG. 3 is a sectional view of a device showing an embodiment of the present invention. It is an example of a Schottky type field effect transistor. On a semi-insulation Ge substrate (impurity concentration: $N_A - N_D < 2 \times 10^{14}/cm^3$) 11, a single-crystal layer 12 of undoped Ge is formed. As stated before, it is made at least 300Å thick. In general, it is made 300Å-3000Å thick. It is formed by the molecular beam epitaxial method. In an example, the front surface of the substrate was the (110) plane, the substrate temperature was 410° C., and the vapor deposition rate was 10Å/minute.

Subsequently, a p-type GaAs layer 14 is formed by raising the substrate temperature to 500° C.-600° C. and employing Be as an impurity. The thickness of the p-type GaAs layer 14 is 300Å, and the impurity concentration is $1 \times 10^{18}/cm^3$. Pt is evaporated to a thickness of about 3000Å without taking the sample substrate out of the growth chamber of a molecular beam epitaxial growth equipment.

The Pt layer other than a part to construct a Schottky gate 16 is removed. The conventional ion milling may be resorted to. Impurity regions are formed in regions (19, 20) to underlie ohmic electrodes by the use of the ion implantation employing Be. The impurity concentration is $1 \times 10^{17}/cm^3$. The regions implanted with the Be ions are so deep as to reach the Ge layer 12. The ohmic electrodes 15 and 17 are formed on the Be ion implanted regions. The material of the ohmic electrode may be, for example, a stacked layer consisting of 0.03 μm of Cr, 0.03 μm of Ti and 0.5 μm of Au. An insulating layer 18 is disposed between the respective electrodes.

Figure 4:
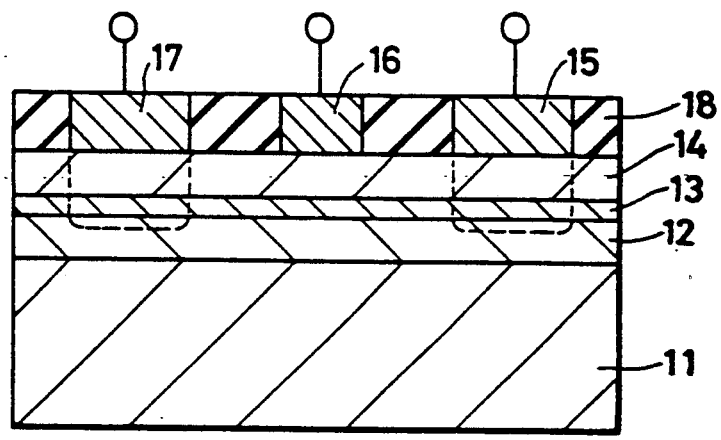

The foregoing structure in which a thin undoped GaAs layer is disposed between the Ge layer 12 and the p-type GaAs layer 14, is as shown in FIG. 4. The structure may be constructed in such a way that, after the undoped Ge layer 12 has been formed on the semi-insulating Ge substrate 11 by the molecular beam epitaxial method, the GaAs layer 13 is grown about 50Å while the shutter of the vaporization source of Be to be used as the impurity is held closed, whereupon the p-type GaAs layer 14 is formed by opening the shutter of the Be vaporization source. The other manufacturing steps are as explained in connection with the structure shown in FIG. 3.

In the present embodiment, the interface of the heterojunction between the GaAs layer and the Ge layer brings forth an abrupt gap in the valence band in such a manner that Be being the impurity does not diffuse into Ge owing to the presence of the undoped GaAs layer 50Å thick. The holes supplied from the GaAs side into Ge and the ionized impurity form a curve in the band structure, and the two-dimensional hole gas is accumulated in the spike-like carrier profile 10 of the band structure. The band structure diagram illustrative of this situation is as shown in FIG. 1.

The ohmic electrode 15 and the two-dimensional hole gas are connected by the P+ region which is formed by the Be ion implantation. In an example, a device having a gate length of 0.5 μm was cooled to 77° K., to reduce scattering attributed to lattices. The channel portion where the holes are conducted is the spike-like carrier profile 10, and since no impurity exists, the impurity scattering is also little. In the state in which 0.5 V was applied across the source and the drain, a transconductance of 300 ms/mm was attained.

The semiconductor device of the present embodiment uses the Schottky gate in contact with p-GaAs, and achieves a very great effect when operated at a low temperature.

Even when materials listed in Table 1 are used instead of GaAs for the semiconductor layer 14, semiconductor devices of the same sort can be fabricated.

TABLE 1

| | Group III-V ternary or quaternary solid solution | Mole fraction |
|---|---|---|
| 1 | $Ga_{1-x}Al_xAs$ | $x = 0.1$ |
| 2 | $Al_xIn_{1-x}P$ | $x = 0.5$ |
| 3 | $Ga_xIn_{1-x}P$ | $x = 0.5$ |
| 4 | $Al_xIn_{1-x}As$ | $x = 0.98$ |
| 5 | $GaAs_xSb_{1-x}$ | $x = 0.99$ |
| 6 | $AlAs_xSb_{1-x}$ | $x = 0.96$ |
| 7 | $Ga_xIn_{1-x}As$ | $x = 0.97$ |
| 8 | $Al_xGa_{1-x}As_ySb_{1-y}$ | $x = 0.3$ |
| | | $y = 0.95$ |
| 9 | $Ga_xIn_{1-x}As_yP_{1-y}$ | $x = 0.822$ |
| | | $y = 0.728$ |
| 10 | $Ga_xIn_{1-x}As_ySb_{1-y}$ | $x = 0.99$ |
| | | $y = 0.99$ |

Figure 5:
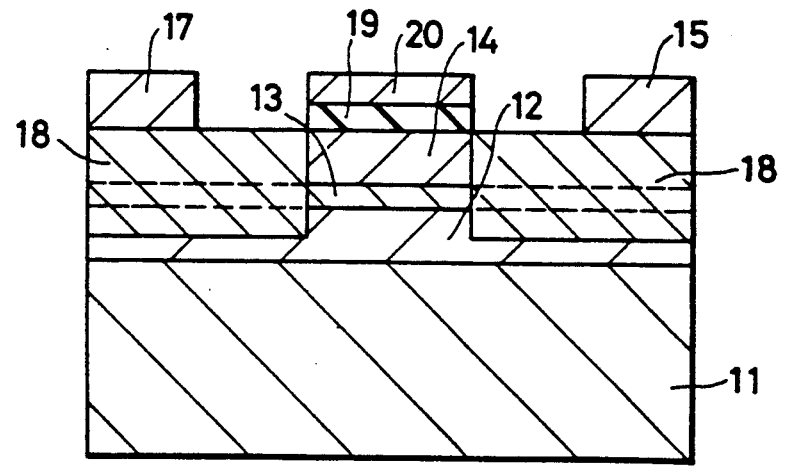

Embodiment 2:

This is an example employing a film of an oxide of GaAlAs as a gate electrode portion, and will be described with reference to FIG. 5.

As explained in Embodiment 1, an undoped Ge layer 12, an undoped GaAs layer 13 and a p-type GaAs layer 14 are grown on a semi-insulating Ge substrate 11 by the molecular beam epitaxial method. Subsequently, while GaAlAs (for example, $Ga_{0.7}Al_{0.3}As$) is being grown, oxygen ($O_2$) gas is introduced into a molecular beam epitaxial growth equipment (abbreviated to the "MBE equipment") so as to grow a GaAlAs oxide film 19 to a thickness of 100Å. Ti and W are evaporated in vacuum, Ti-W in parts other than a gate portion 20 is removed, Be ions are further implanted at 30 kV to a depth of about 500Å by employing the gate portion as a mask, and the resultant substrate is subsequently annealed at 600° C. for 20 minutes. Thus, a P+ semiconductor region 18 implanted with the Be ions is formed. Ohmic electrodes 15 and 17 are formed on the P+ semiconductor region 18. Using the interface between the undoped Ge layer and GaAs layer as a channel region, a fast operation is possible.

By employing any of the foregoing ternary or quaternary solid solutions of the group III-V, a similar construction can be realized as the p-type semiconductor layer 14.

Figure 6:
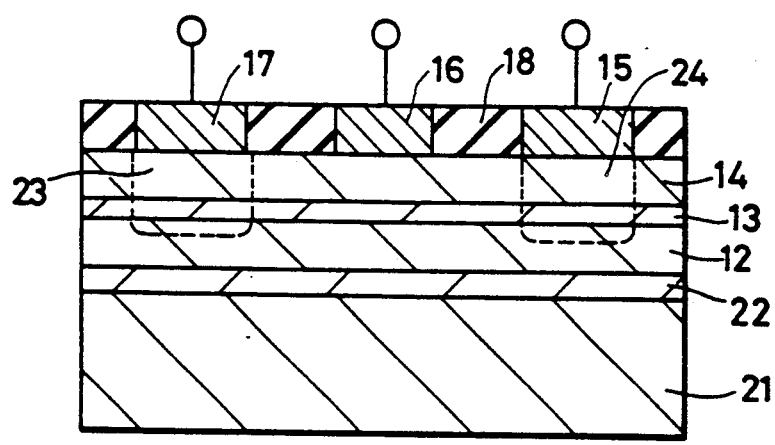
Figure 7:
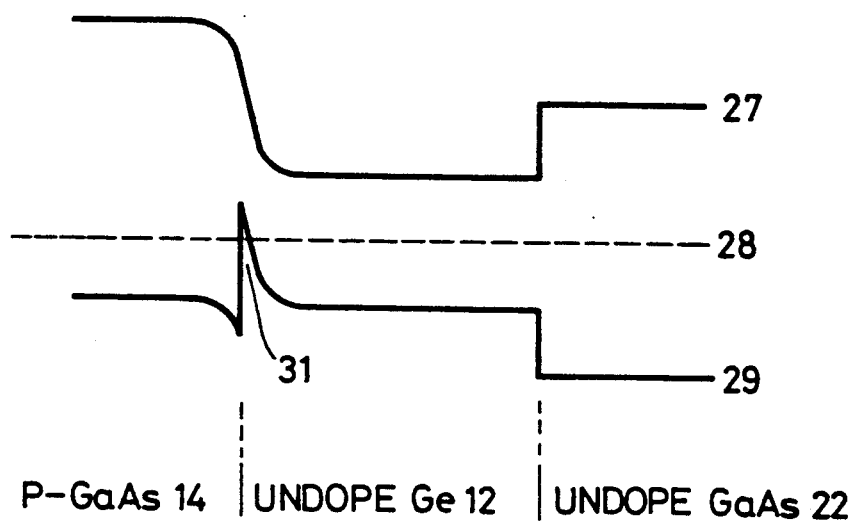
FIG. 7 is a schematic energy band diagram of a double hetero-structure made of Ge and GaAs.

Embodiment 3:

This is an example employing a GaAs substrate, and will be described with reference to FIGS. 6 and 7.

A semi-insulating GaAs substrate 21 (face orientation: (110)) is lapped by the mechanochemical method, and is further etched with an etchant consisting of $H_2SO_4$: $H_2O_2$: $H_2O$ at a volumetric ratio of 3:1:1. Thereafter, the substrate is cleaned by Ar ions at 750 eV in the sample preparing chamber of an MBE equipment. The substrate temperature is set at 575° C. Further, after shutting up the ion source of the Ar ions, annealing is carried out at the same temperature. The GaAs substrate is shifted into a crystal growth chamber and has its temperature set within a range of 500°–600° C., whereupon an undoped GaAs layer (500Å thick) 22 is crystal-grown at a rate of 5–30Å/min. Subsequently, the substrate temperature is fixed within a range of 350°–525° C., to grow an undoped Ge layer 12 to a thickness of 500Å. Subsequently, the substrate temperature is fixed again to 500°–600° C., to grow an undoped GaAs layer 13 to a thickness of 40Å. Thereafter, Be used as a p-type dopant and the molecular beam of GaAs are simultaneously thrown onto the crystal so as to grow a p-type GaAs ($p = 1 \times 10^{18}/cm^3$) layer 14 to 500Å. An energy band structure diagram of the stacked structure in this case is shown in FIG. 7. In FIG. 7, the very thin undoped GaAs layer 13 is omitted, because it does not affect the fundamental operation. Numeral 27 indicates the bottom part of a conduction band, numeral 28 the Fermi level, and numeral 29 the top part of a valence band. Shown at numeral 31 is the spike-like carrier profile of the valence band. Basically, the principle explained with reference to FIG. 1 holds. The Ge layer 12 is sandwiched between the GaAs layers 22 and 14 of great band gaps, and holes are trapped into the Ge layer 12 used as a channel. When the undoped GaAs layer 22 is turned into p-GaAs, holes are injected into Ge from the part of such p-GaAs layer located on the Ge side, and the two-dimensional hole gas increases, so that the current of a device increases. On the other hand, however, there occur such difficulties that a normally-off operation is difficult and that a residual current at pinch-off is great.

In an example of the present semiconductor device, the hole mobility at 77° K. was 3000 $cm^2V^{-1}sec^{-1}$, and the transconductance was 430 ms/mm at a source-drain voltage of 0.5 V.

Even when the GaAs layer 13 was replaced with an undoped $GaAs_{0.9}Sb_{0.1}$ layer (thickness: 40Å) and the p-type GaAs layer 14 was replaced with a p-type $GaAs_{0.9}Sb_{0.1}$ layer (dopant: $p = 1 \times 10^{18}/cm^3$, thickness: 500Å), similar operations could be realized.

Figure 8:
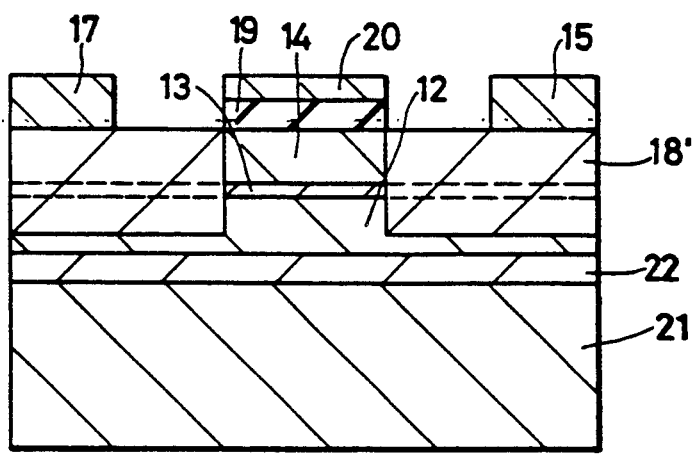

Embodiment 4:

Using a semi-insulating GaAs substrate, a semiconductor device was manufactured by the method described in Embodiment 2. A sectional view of the device is shown in FIG. 8. The same symbols as in FIG. 6 denote the same substance layers. The point that after the formation of the p-type GaAs layer 14, the GaAlAs oxide film 19 is formed by introducing oxygen gas whilst growing $Ga_{0.7}Al_{0.3}As$; the point that the Be ion implanted region 18' is formed; the formation of the electrodes; etc. are quite the same as explained in Embodiment 2.

In the figure, numeral 22 represents undoped GaAs, which is intended to better the interface between Ge and GaAs.

In the present semiconductor device, the gate 20 is formed on the GaAlAs oxide film 19, and the gate current does not flow. Further, a double-heterostructure in which the undoped Ge layer 12 forming a channel is sandwiched is constructed, and the residual current is small. In addition, since the gate and the P+ region are of the self-alignment structure, an FET of short gate length in which the source-drain distance is small can be readily fabricated. The embodiment has such numerous advantages.

Even when the p-type GaAs layer 14 was replaced with a p-type $Ga_{0.9}Al_{0.1}As$ layer, a similar operation could be performed.

Figure 9:
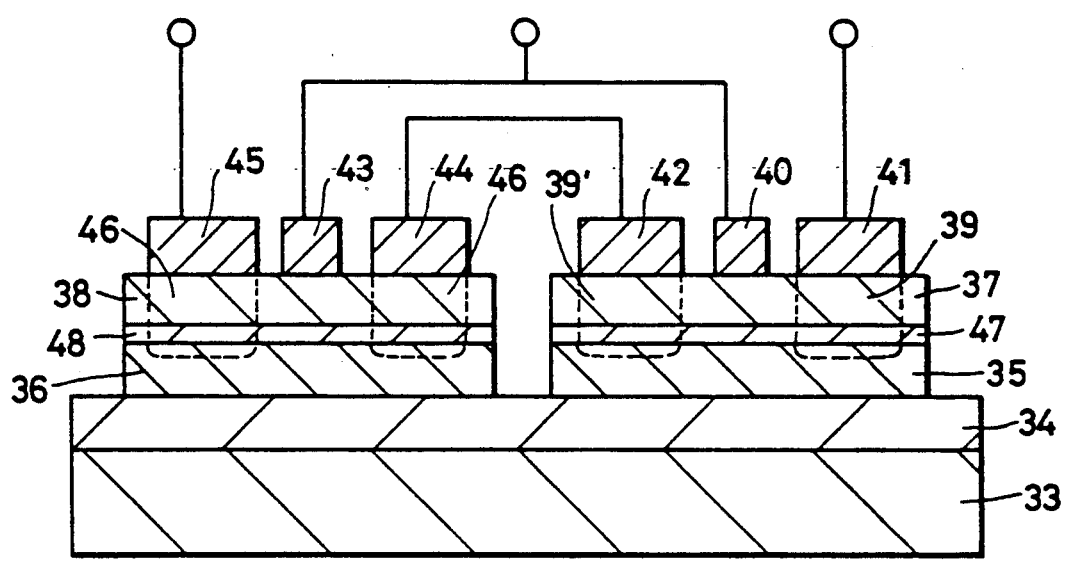
FIG. 9 is a sectional view of the essential portions of a complementary semiconductor device constructed upon the principle of the present invention.
Figure 10:
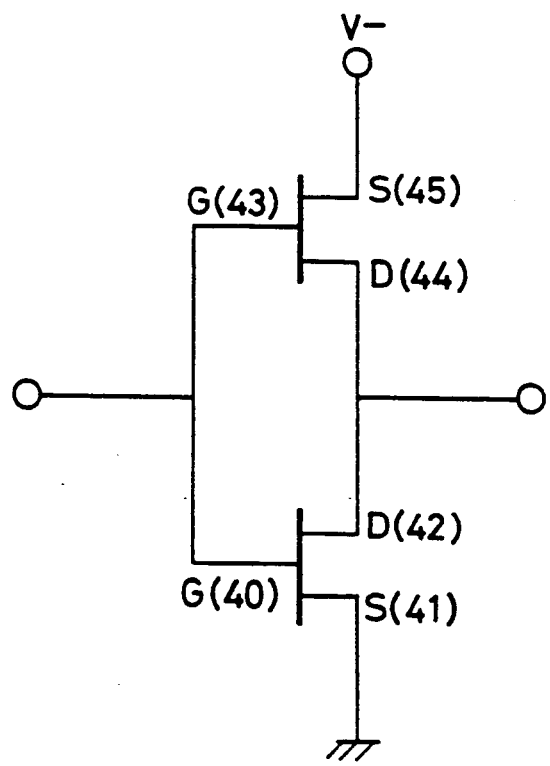
FIG. 10 is a diagram showing an equivalent circuit of the semiconductor device in FIG. 9.

Embodiment 5:

A complementary FET was fabricated by combining the two-dimensional hole gas developing at the interface between a p-GaAs layer and an undoped Ge layer and a two-dimensional electron gas developing at the interface between n-$Ga_{0.7}Al_{0.3}As$ and undoped GaAs. FIG. 9 is a sectional view of the essential portions of this semiconduc device, while FIG. 10 is an equivalent circuit diagram thereof. An n-type FET having a gate 43 and a p-type FET having a gate 40 can execute a logic operation with a very low power consumption because currents do not simultaneously flow across sources and drains in response to an input signal of one polarity.

On a semi-insulating GaAs substrate 33, an undoped $Ga_{0.7}Al_{0.3}As$ layer 34 is grown to a thickness of 1 μm by the MBE method. This layer is usually made about 300 Å–1 μm thick. An undoped Ge layer 35 is grown on a part of the undoped $Ga_{0.7}Al_{0.3}As$ layer 34 to a thickness of 0.05 μm by the MBE method, and an undoped GaAs layer 47 and a p-type GaAs layer 37 are further grown on the undoped Ge layer 35 to respective thicknesses of 40 Å and 0.03 μm. The semiconductor element having a p-type channel region is formed in these stacked regions. Numerals 39 and 39' in FIG. 9 indicate $p^+$ semiconductor regions formed by the ion implantation, and ohmic electrodes 41 and 42 are formed thereon. Numeral 40 indicates the gate electrode. The concrete construction of the element is substantially the same as in Embodiment 3.

On the other area of the undoped $Ga_{0.7}Al_{0.3}As$ layer 34, an undoped GaAs layer 36 is formed to a thickness of 0.05 μm, and an undoped $Ga_{0.7}Al_{0.3}As$ layer 48 being 60 Å thick and an n-type $Ga_{0.7}Al_{0.3}As$ (n-concentration: $7 \times 10^{17}$ cm$^{-3}$) layer 38 are further formed thereon. The semiconductor element having an n-type channel region is formed in these stacked regions. In the figure, numerals 46 and 46' indicate regions implanted with Si ions, and ohmic electrodes 44 and 45 are formed thereon. Numeral 43 indicates the gate electrode.

Figure 11:
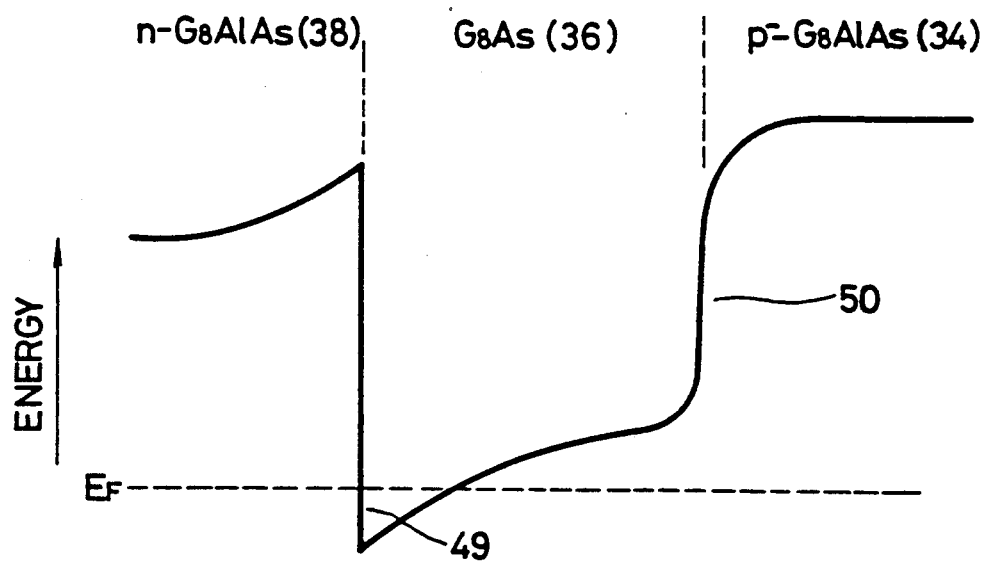
FIG. 11 is a schematic energy band diagram of a stacked layer of n-GaAlAs-GaAs-p-GaAlAs.

The n-type channel semiconductor device uses as carriers the two-dimensional electron gas which develops at the interface between n-GaAlAs and undoped GaAs. FIG. 11 shows the band structure of these semiconductor regions. A solid line indicates the lower ends of conduction bands. A spike-like carrier profile 49 appears in the conduction band based on a heterostructure. $E_F$ indicates the Fermi level at the application of a gate voltage. Electrons are accumulated in a part lower than the Fermi level, and perform two-dimensional conduction. In this example, the p-GaAlAs layer 34 exists in contact with the GaAs layer 36. Owing to this layer, a potential barrier 50 is formed in the conduction band and hinders electrons from migrating onto the substrate side, so that the pinch-off characteristic becomes excellent.

As to the n-$Ga_{1-x}Al_xAs$ layer 38, $0.02 \leq x$ is effectively used. The impurity concentration is made at least $10^{16}/cm^2$–$10^{18}/cm^2$ or so. The GaAs layer 36 has its impurity concentration made $10^{14}$–$10^{15}/cm^2$ or less. Of course, it may be undoped.

The construction of the n-channel region can be realized even with a different group III-V compound semiconductor. More specifically, a heterojunction is formed of a semiconductor layer of narrow forbidden band and a semiconductor layer of broad forbidden band. The semiconductor layer of broad forbidden band is doped with an impurity, carriers are transferred into a semiconductor layer of great electron affinity, and the carriers developing at the interface of the heterojunction are controlled.

Multilayered heterojunction devices of high electron mobility according to such construction are described in detail in U.S. Pat. No. 4,194,935 (Patented: May 25, 1980). The principle may be applied.

The crystal growth in the device of the present embodiment is preferably performed by the MBE method employing a mask.

First, on the GaAs substrate 33, the undoped GaAlAs layer 34 being 1 μm thick is grown on the whole surface in an MBE growth chamber. Thereafter, using a Mo metal mask which has an opening in only the area of the p-type FET, the layers 35 and 37 are grown. Subsequently, the mask is moved to the area of the n-type FET, and the layers 36 and 38 are grown. The subsequent process is similar to the ordinary process for fabricating FETs. That is, the parts 39 and 39' are implanted with Be ions to form the $p^+$ regions as the underlying regions for the ohmic electrodes, and the parts 46 and 46' are implanted with Si ions to form the $n^+$ regions.

As regards the materials of the electrodes, the electrodes 41, 42 and 43 are made of Ti and W simultaneously evaporated, the electrode 40 is made of Pt, and the electrodes 44 and 45 are made of an Au-Ge-Ni alloy.

In test patterns formed on an identical wafer, the low field mobility of electrons in the n-type channel semiconductor element was $42000$ cm$^2$V$^{-1}$sec$^{-1}$ at 77° K., and that in the p-type channel semiconductor element was $29500$ cm$^2$V$^{-1}$sec$^{-1}$. These values correspond to about 100 times the mobility in a Si-MOS transistor when uniformly doped with an impurity at a concentration of $1 \times 10^{17}/cm^3$, and the present semiconductor device is one order greater in the value of the transconductance $g_m$ than the p-type channel MOS transistor employing Si.

FIG. 10 shows the equivalent circuit of this semiconductor device, and numerals in the figure indicate the corresponding parts in FIG. 9.

Even when the undoped GaAs layer 47 was replaced with an undoped $Ga_{0.7}Al_{0.3}As$ layer and the p-type GaAs layer 37 was replaced with a p-type $Ga_{0.7}Al_{0.3}As$ layer, similar operations could be performed.

Needless to say, the complementary field effect transistor of the present embodiment can be realized even with the other group III-V compound semiconductor materials along the purport thus far described. In this case, Ge is of course used for constructing the device region of high hole mobility.

What is claimed is:

1. A semiconductor device comprising:
   a first semiconductor layer having a first energy bandgap, and containing substantially no impurities;
   a second semiconductor layer having a second energy bandgap larger than the first energy bandgap, and of p-type conductivity, wherein an interface between the first and the second semiconductor layers forms a first heterojunction;
   a pair of electrodes being electrically connected to the first semiconductor layer;
   a means for controlling hole carriers developing at the first heterojunction;
   a third semiconductor layer having a third energy bandgap, wherein an interface between the first and the third semiconductor layers forms a second heterojunction, and the first semiconductor layer is disposed between the second and the third semiconductor layers so that the hole carriers are trapped in the first semiconductor layer such that the first semiconductor layer is channel for hole carriers;
   a fourth semiconductor layer, containing substantially no impurities and having a first forbidden band;
   a fifth semiconductor layer, with a third heterojunction being formed between the fourth and fifth semiconductor layers, the fifth semiconductor layer being of n-type conductivity and having a second forbidden band broader than the first forbidden band;

a pair of electrodes electrically connected to the fourth semiconductor layer; and a means for controlling electron carriers at the third heterojunction, a channel for the electron carriers being provided in the fourth semiconductor layer of the third heterojunction.

2. A semiconductor device as defined in claim 1, wherein said second semiconductor layer is a GaAs layer.

3. A semiconductor device as defined in claim 1, wherein said second semiconductor layer contains an impurity of p-type conductivity at impurity concentration of $5 \times 10^{16}/cm^3$ to $2 \times 10^{18}/cm^3$.

4. A semiconductor device as defined in claim 3, wherein said first semiconductor layer has an impurity concentration of at most $1 \times 10^{15}/cm^3$.

5. A semiconductor device as defined in claim 3, wherein said second semiconductor layer is made of a material selected from the group consisting of:

6. A semiconductor device as defined in claim 4, wherein said second semiconductor layer has a thickness of 300 Å—3000 Å.

$Al_xIn_{1-x}P$ ($0.4 \leqq X \leqq 0.6$),
$Al_xIn_{1-x}As$ ($0.9 \leqq X \leqq 1$),
$GaAs_xSb_{1-x}$ ($0.9 \leqq X < 1$),
$Ga_xIn_{1-x}P$ ($0.4 \leqq X \leqq 0.6$) and
$Ga_xIn_{1-x}As$ ($0.9 \leqq X < 1$).

7. A semiconductor device as defined in claim 1, wherein said second semiconductor layer has an energy bandgap greater than 0.66eV and lattice constants of $5.658 \approx 0.05$ Å.

8. A semiconductor device as defined in claim 1, wherein said means for controlling hole carriers developing at the first heterojunction comprises a metal layer forming a Schottky gate with the second semiconductor layer.

9. A semiconductor device as defined in claim 1, wherein said means for controlling hole carriers developing at the first heterojunction comprises a gate formed on the second semiconductor layer, said gate including an oxide layer formed on the second semiconductor layer and a metal layer formed on the oxide layer.

10. A semiconductor device as defined in claim 9, wherein the oxide layer is a GaAlAs oxide layer, and the metal layer is a Ti-W layer.

11. A semiconductor device as defined in claim 1, wherein said first semiconductor layer is a Ge layer.

12. A semiconductor device as defined in claim 1, wherein the first semiconductor layer is made of Ge, and the second semiconductor layer is made of III-V compound semiconductor.

13. A semiconductor device as defined in claim 1, wherein the second semiconductor layer has a thin semiconductor region therein, containing substantially no impurities, at the first heterojunction.

14. A semiconductor device as defined in claim 1, wherein the third semiconductor layer is of the same semiconductor material as the second semiconductor layer.

15. A semiconductor device as defined in claim 1, wherein the first, second and third semiconductor layers form a first semiconductor element having hole carriers, and the fourth and fifth semiconductor layers form a second semiconductor element having electron carriers, whereby a complementary semiconductor device is provided.

16. A semiconductor device as defined in claim 15, wherein the first through fifth semiconductor layers are provided on a single substrate, the complementary semiconductor device being provided on the single substrate.

17. A semiconductor device as defined in claim 16, wherein the third semiconductor layer is provided on said single substrate and extends beneath the fourth and fifth semiconductor layers, so as to extend between (1) the substrate and (2) the first, second, fourth and fifth semiconductor layers.

18. A semiconductor device as defined in claim 17, wherein the first and fourth semiconductor layers are in contact with the third semiconductor layer.

19. A semiconductor device as defined in claim 17, wherein the third semiconductor layer extends continuously between (1) the substrate and (2) the first, second, fourth and fifth semiconductor layers.

20. A semiconductor device as defined in claim 18, wherein the third semiconductor layer is of p-type conductivity.

21. A semiconductor device comprising:

a first semiconductor layer having a first energy bandgap, and containing substantially no impurities;

a second semiconductor layer having a second energy bandgap larger than the first energy bandgap, and of p-type conductivity, wherein an interface between the first and the second semiconductor layers forms a first heterojunction;

a pair of electrodes being electrically connected to the first semiconductor layer;

a means for controlling hole carriers developing at the first heterojunction;

a third semiconductor layer having a third energy bandgap, and containing substantially no impurities;

a fourth semiconductor layer having a fourth energy bandgap larger than the third energy bandgap, and of n-type conductivity, wherein an interface between the third and the fourth semiconductor layers forms a second heterojunction;

a pair of electrodes being electrically connected to the third semiconductor layer;

a means for controlling electron carriers developing at the second heterojunction; and a fifth semiconductor layer having a fifth energy bandgap larger than the first energy bandgap, wherein an interface between the first and the fifth semiconductor layers forms a third heterojunction and the first semiconductor layer is disposed between the second and the fifth semiconductor layers so that the hole carriers are trapped into the first semiconductor layer such that the first semiconductor layer is a channel for hole carriers.

22. A semiconductor device comprising:

a first semiconductor layer having a first energy bandgap, and containing substantially no impurities;

a second semiconductor layer having a second energy bandgap larger than the first energy bandgap, and of p-type conductivity, wherein an interface between the first and the second semiconductor layers forms a first heterojunction;

a pair of electrodes being electrically connected to the first semiconductor layer;

a means for controlling hole carriers developing at the first heterojunction; and a third semiconductor layer having a third energy bandgap, wherein an interface between the first and the third semiconductor layers forms a second heterojunction, the first semiconductor layer is disposed between the second and the third semiconductor layers so that the hole carriers are trapped in the first semiconductor layer such that the first semiconductor layers is a channel for hole carriers, and each of the second and third semiconductor layers have larger energy bandgaps than the energy bandgap of the first semiconductor layer; and a fourth semiconductor layer, containing substantially no impurities and having a first forbidden band;

a fifth semiconductor layer, with a third heterojunction being formed between the fourth and fifth semiconductor layers, the fifth semiconductor layer being of n-type conductivity and having a second forbidden band broader than the first forbidden band;

a pair of electrodes electrically connected to the fourth semiconductor layer; and a means for controlling electron carriers at the third heterojunction, a channel for the electron carriers being provided in the fourth semiconductor layer at the third heterojunction.

23. A semiconductor device as claimed in claim 22, wherein the third semiconductor layer contains substantially no impurities.

24. A semiconductor device as claimed in claim 22, wherein the first, second and third semiconductor layers form a first semiconductor element having hole carriers, and the fourth and fifth semiconductor layers form a second semiconductor element having electron carriers, whereby a complementary semiconductor device is provided.

25. A semiconductor device as defined in claim 24, wherein the first through fifth semiconductor layers are provided on a single substrate, the complementary semiconductor device being provided on the single substrate.

26. A semiconductor device as defined in claim 25, wherein the third semiconductor layer is provided on said single substrate and extends beneath the fourth and fifth semiconductor layers, so as to extend between (1) the substrate and (2) the first, second, fourth and fifth semiconductor layers.

27. A semiconductor device as defined in claim 26, wherein the first and fourth semiconductor layers are in contact with the third semiconductor layer.

28. A semiconductor device as claimed in claim 26, wherein the third semiconductor layer extends continuously between (1) the substrate and (2) the first, second, fourth and fifth semiconductor layers.

29. A semiconductor device as defined in claim 27, wherein the third semiconductor layer contains p-type conductivity.

30. A semiconductor device as defined in claim 1, wherein each of the second and third semiconductor layers are made of III-V semiconductor material.

* * * * *